United States Patent
Ing et al.

(10) Patent No.: US 10,784,668 B2
(45) Date of Patent: Sep. 22, 2020

(54) LAMINATE BUSBARS FOR BATTERY MODULE DESIGN

(71) Applicant: NIO USA, Inc., San Jose, CA (US)

(72) Inventors: Adam H. Ing, San Francisco, CA (US); Shubham Saurav, San Jose, CA (US); Alexander J. Smith, Mountain View, CA (US)

(73) Assignee: NIO USA, Inc., San Jose, CA (US)

( * ) Notice: Subject to any disclaimer, the term of this patent is extended or adjusted under 35 U.S.C. 154(b) by 0 days.

(21) Appl. No.: 16/230,499

(22) Filed: Dec. 21, 2018

(65) Prior Publication Data
US 2020/0203941 A1   Jun. 25, 2020

(51) Int. Cl.

| | |
|---|---|
| *H01M 10/42* | (2006.01) |
| *H01M 10/48* | (2006.01) |
| *H05K 1/11* | (2006.01) |
| *H01M 2/20* | (2006.01) |
| *H02G 5/00* | (2006.01) |
| *H01M 2/30* | (2006.01) |
| *H01M 4/02* | (2006.01) |

(52) U.S. Cl.
CPC ............ *H02G 5/005* (2013.01); *H01M 2/206* (2013.01); *H01M 2/30* (2013.01); *H01M 10/425* (2013.01); *H01M 10/482* (2013.01); *H01M 10/486* (2013.01); *H05K 1/118* (2013.01); *H01M 2004/025* (2013.01)

(58) Field of Classification Search
CPC ...... H01M 2/105; H01M 2/202; H01M 2/206; H01M 2/30; H01M 2220/20; H01M 2004/025; H01M 2004/028; H01M 2004/029; H01M 10/486; H01M 10/482; H01M 10/425; H05K 1/118; H01L 23/5386; H02G 5/005
See application file for complete search history.

(56) References Cited

U.S. PATENT DOCUMENTS

| | | | |
|---|---|---|---|
| 8,541,130 B2 * | 9/2013 | Muis ................. | H01M 2/206 429/158 |
| 9,147,875 B1 * | 9/2015 | Coakley ............. | H01M 2/202 |
| 9,224,996 B2 * | 12/2015 | Kwag ................ | H01M 2/105 |
| 9,545,010 B2 | 1/2017 | Coakley et al. | |
| 9,844,148 B2 | 12/2017 | Coakley et al. | |
| 2011/0091749 A1 * | 4/2011 | Chow ................ | H01M 2/1252 429/50 |
| 2011/0151315 A1 * | 6/2011 | Masson ............. | H01M 2/1077 429/159 |

(Continued)

OTHER PUBLICATIONS

3M™ Flame Barrier FRB-BK Series, Data Sheet, 3M, 2013, 5 pages.

(Continued)

*Primary Examiner* — Roshn K Varghese
(74) *Attorney, Agent, or Firm* — Sheridan Ross P.C.

(57) ABSTRACT

A laminated busbar assembly includes positive and negative leads supported by an insulative layer. The insulative layer as well as the positive and negative leads are thin and flexible, thus facilitating connection of the positive and negative leads with the terminals of the electric cells of a battery module. The laminated busbar assembly may include voltage measurement wires and/or temperature sensors for measuring voltage and/or temperature, respectively.

20 Claims, 3 Drawing Sheets

(56) References Cited

U.S. PATENT DOCUMENTS

| | | | |
|---|---|---|---|
| 2011/0223776 A1* | 9/2011 | Ferber, Jr. | H05K 3/325 |
| | | | 439/39 |
| 2014/0212695 A1 | 7/2014 | Lane et al. | |
| 2016/0043359 A1* | 2/2016 | Miyake | H01M 2/0237 |
| | | | 429/90 |
| 2016/0181579 A1* | 6/2016 | Geshi | H01M 2/206 |
| | | | 429/61 |
| 2017/0048978 A1* | 2/2017 | Fees | H01G 11/10 |
| 2017/0279104 A1* | 9/2017 | Beverley | H01M 2/206 |
| 2019/0081308 A1* | 3/2019 | Capati | H01M 2/206 |
| 2019/0109352 A1* | 4/2019 | Kramer | H01M 10/653 |

OTHER PUBLICATIONS

3M™ Flame Barrier FRB-NC Series, Data Sheet, 3M, 2012, 3 pages.
3M™ Flame Barrier FRB-NT Series, Data Sheet, 3M, 2012, 4 pages.
3M™ Flame Barrier FRB-NT Series, Data Sheet, 3M, 2013, 6 pages.

\* cited by examiner

LAMINATE BUSBARS FOR BATTERY MODULE DESIGN

FIELD

The present disclosure is generally directed to busbars, and more particularly to laminated busbars.

BACKGROUND

Advances in battery technology have resulted in the increasing use of large batteries, comprising tens, hundreds, or even thousands of individual cells, for applications such as powering various electrical components of vehicles (including vehicles designed for travel over land and water and through the air) and storing electricity generated using renewable energy sources (e.g., solar panels, wind turbines). A busbar is used to collect electricity generated by each cell (when the battery is in a discharge state) and route the collected electricity to the battery terminal. The busbar also routes electricity provided via the battery terminal (when the battery is in a recharge state) to the individual terminals of each cell within the battery. For the battery to operate safely and efficiently, the connection between the busbar and the terminal of each cell must be sufficiently secure to remain intact despite any forces resulting from vibration, expansion due to changing temperature, or other conditions to which the battery might be subjected. If a connection between the busbar and the terminal of a cell fails, then the cell will no longer contribute to the proper functioning of the battery. Additionally, if any short circuits are caused by such failure, then the battery could catch fire or otherwise be rendered inoperable and/or unsafe.

U.S. Patent Application Publication No. 2014/0212695, entitled "Flexible Printed Circuit as High Voltage Interconnect in Battery Modules," describes a flexible printed circuit individually coupled to each electrode of each cell of a matrix of cells of a battery pack. U.S. Pat. No. 9,545,010, entitled "Interconnect for Battery Packs," describes interconnect circuits and methods for forming the same. U.S. Pat. No. 9,844,148, entitled "Method of Forming a Circuit for Interconnecting Electrical Devices," describes interconnect circuits for interconnecting arrays of devices and methods of forming such interconnect circuits as well as connected such circuits to the devices. The entirety of each of the foregoing references is hereby incorporated herein in its entirety.

DETAILED DESCRIPTION

Figure 1:
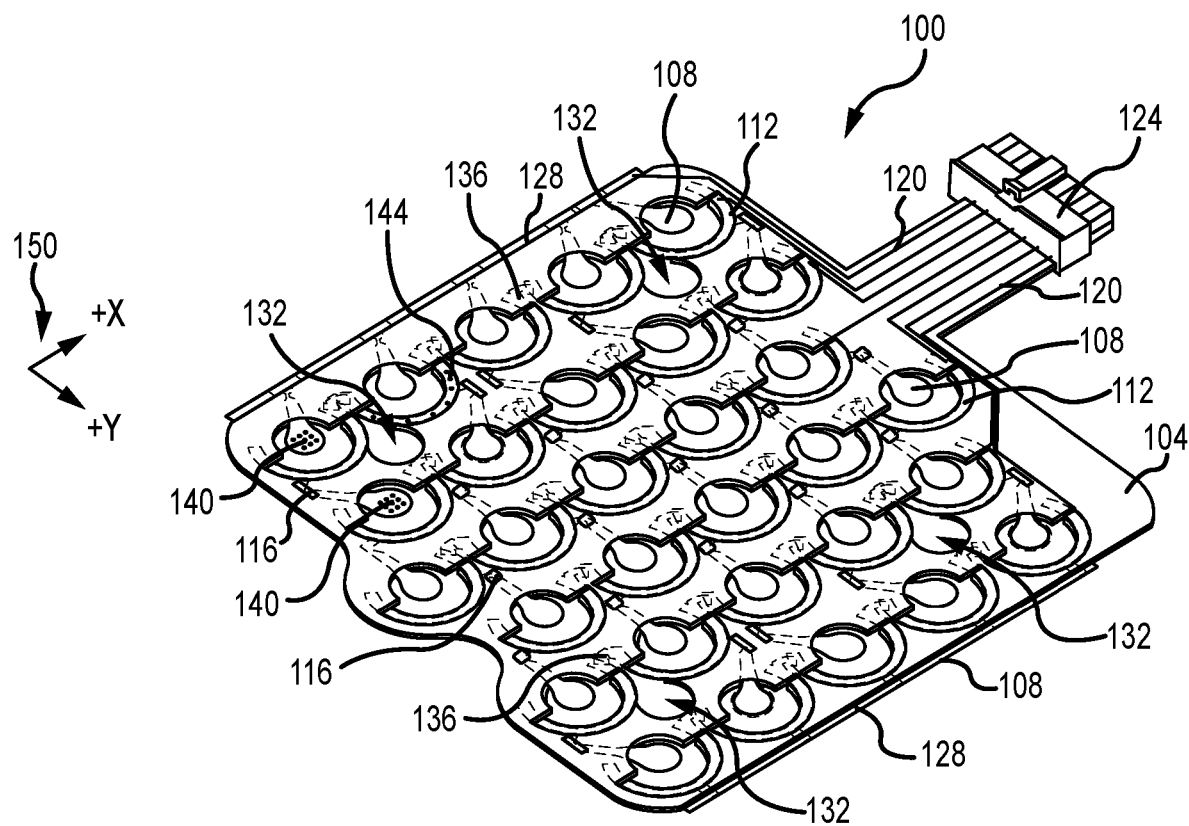
FIG. 1 shows a laminate busbar assembly in accordance with embodiments of the present disclosure.

Before any embodiments of the disclosure are explained in detail, it is to be understood that the disclosure is not limited in its application to the details of construction and the arrangement of components set forth in the following description or illustrated in the drawings. The disclosure is capable of other embodiments and of being practiced or of being carried out in various ways. Also, it is to be understood that the phraseology and terminology used herein is for the purpose of description and should not be regarded as limiting. The present disclosure may use examples to illustrate one or more aspects thereof. Unless explicitly stated otherwise, the use or listing of one or more examples (which may be denoted by "for example," "by way of example," "e.g.," "such as," or similar language) is not intended to and does not limit the scope of the present disclosure.

Battery cells in modules are typically connected via bent busbars and wire bonding. Bent busbars suffer from various drawbacks, including high cost and difficulty in assembly (including creating bends in the busbars sufficient to achieve the needed electrical clearance and ensuring that each cell is securely connected to a busbar). The present disclosure discloses laminated busbars, embodiments of which overcome one or more of these drawbacks. In some embodiments, laminated busbars as disclosed herein may integrate both voltage and temperature sensing capabilities into one assembly. Particularly in embodiments where the laminate is extremely thin, the bend in the busbars can also be removed, thus improving ease of assembly and reducing cost. Fusible links may also be incorporated into laminate busbar designs as disclosed herein.

FIG. 1 depicts a laminated busbar assembly 100 according to one embodiment of the present disclosure. The laminated busbar assembly 100 comprises a dielectric or insulator sheet 104 comprising a heat-resistant material. The dielectric sheet 104 supports pieces or sections of electrically conductive foil in a predetermined arrangement. For example, the pieces or sections of electrically conductive foil may be partially encased in, or sandwiched within, or otherwise supported by the dielectric sheet 104. The pieces or sections of electrically conductive foil may be arranged in one or more rows. In some embodiments, the conductive foil is or comprises aluminum, an aluminum alloy, copper, a copper alloy, steel, a steel alloy and/or another metal or metal alloy. In other embodiments, the conductive foil comprises an aluminum base that has been coated in copper. In still further embodiments, the conductive foil comprises a first metal (whether aluminum or an aluminum alloy, copper or a copper alloy, steel or a steel alloy, or another metal or metal alloy) coated or plated with a second metal (whether copper or a copper alloy, or nickel or a nickel alloy, or another metal or metal alloy). The conductive foil may comprise one or more metal alloys. The conductive foil may comprise an additive to improve corrosion resistance. Any conductive foil may be used. The heat-resistant material may be an inorganic-based material and may also be a halogen free material. The heat-resistant material may have a UL 94V-0 flame retardant rating, or a UL94-5VA flame retardant rating. The heat-resistant material may be configured to exhibit little if any temperature-induced expansion or contraction/shrinkage. The heat-resistant material may be, for example, flame barrier material such as a 3M™ Flame Barrier FRB-series material. The 3M™ Flame Barrier FRB series includes the FRB-BK subseries, the FRB-NC subseries, the FRB-NT subseries, and the FRB-WT subseries. Other heat-resistant materials may also be used.

In some embodiments, the dielectric sheet 104 by itself is about 200 microns thick, with variations in the thickness of plus or minus 10 microns. In other embodiments, the dielectric sheet 104 is between 150 microns thick and 250 microns thick. In still other embodiments, the dielectric sheet 104 is between 50 and 300 microns thick. In still other embodiments, the dielectric sheet 104 is between about 100 and 1000 microns thick.

The conductive foil is also about 200 microns thick, with variations in the thickness of plus or minus 10 microns. In other embodiments, the conductive foil is between 150 microns thick and 250 microns thick. In still other embodiments, the conductive foil is between 50 and 300 microns thick. In still other embodiments, the conductive foil is between about 100 and 1000 microns thick.

The total thickness of the laminated busbar assembly 100, including the dielectric sheet 104 and the conductive foil supported thereby, may be between 100 and 600 microns. In some embodiments, the total thickness of the laminated busbar assembly may be between about 300 and about 500 microns (plus or minus 10 microns). In still other embodiments, the total thickness may vary between about 200 microns (plus or minus 10 microns), and about 400 microns (plus or minus 10 microns). In still further embodiments, the total thickness may vary between about 100 microns (plus or minus 10 microns), and about 1000 microns (plus or minus 10 microns).

The laminated busbar assembly 100 comprises a plurality of pairs of positive leads 108 and negative or ground leads 112, arranged in rows. The positive leads 108 and the negative or ground leads 112 are formed by the pieces or sections of conductive foil referenced above. The positive leads 108 and the negative or ground leads 112 comprise bare metal foil that extends into, is partially encased within, is sandwiched within, or is otherwise supported by the dielectric sheet 104. Each positive lead 108 comprises a substantially circular end configured to cover the positive terminal of a battery cell. Each negative or ground lead 112 is arranged in a crescent shape that partially surrounds, but is separated from, a corresponding positive lead 108. A positive lead 108 may be separated from the corresponding negative or ground lead 112 by an air gap and/or by a portion of the dielectric sheet 104. The metal foil used for the leads 108 and 112 may be or comprise aluminum, copper, or any metal or conductor other than aluminum or copper. The metal foil used for the leads 108 and 112 may be any material or combination of materials described herein with respect to the conductive foil Although the laminated busbar assembly 100 comprises positive leads 108 and negative or ground leads 112 having the shape described and illustrated, in other embodiments the positive leads 108 and/or the negative or ground leads 112 may have different shapes.

Additional details regarding the laminated busbar assembly 100 will be provided with reference to the coordinate system 150, which denotes a positive x direction and a positive y direction. References to a negative x direction refer to the direction that is exactly opposite of the positive x direction, and references to a negative y direction refer to the direction that is exactly opposite of the positive y direction.

The substantially circular end of most of the positive leads 108 tapers into an arm or bridge that extends (usually in the negative y direction, but sometimes at an angle between a negative y direction and a positive or negative x direction) into the dielectric sheet 104 and terminates at a fusible link 116. The fusible links 116 are designed to disconnect or burn out when exposed to excessive current (generating excessive heat). Each fusible link 116 is connected by one or more wires or leads to a negative lead 112 adjacent the fusible link 116. As a result, the positive leads 108 in one row are in electrical communication with the negative or ground leads 112 of an adjacent row, via the fusible link 116. The fusible links 116 may be provided in a window of the dielectric sheet 104 (e.g., the fusible links 116 may not be encased or sandwiched within the dielectric sheet 104) so that the dielectric sheet 104 does not interfere with the intended purpose of the fusible links 116.

The precise amount of current (and hence the precise amount of heat) required to burn each fusible link 116 may depend, for example, on the cross-sectional area of the positive lead 108 at the fusible link 116 and/or of the wires or leads that connect the fusible link 116 to an adjacent negative lead 112. The precise amount of current (and hence the precise amount of heat) required to burn each fusible link 116 may also depend, for example, on the materials used for the positive lead 108, for the wires or leads that connect the positive lead 108 to an adjacent negative lead 112, and/or for any solder or other adhesive used to secure the positive lead 108 to the wires or leads that connect the positive lead 108 to an adjacent negative lead 112.

Each negative or ground lead 112 is in electrical communication with the adjacent negative or ground lead 112, if any, in the positive x direction, and to the adjacent negative or ground lead 112, if any, in the negative x direction. Adjacent negative or ground leads 112 may be connected by a flexible joint 136 that can expand and contract in the positive x/negative x directions. The flexible joints 136 improve the resiliency of the laminated busbar assembly 100 by reducing the likelihood that one negative or ground lead 112 will detach from an adjacent negative or ground lead 112 as a result of mechanical stresses to which the laminated busbar assembly 100 may be exposed during operational use thereof (e.g., in a vehicle such as a car or airplane). In some embodiments, the fusible links 116 may also comprise flexible joints such as the flexible joints 136 to further enhance the resiliency of the laminated busbar assembly 100 to mechanical stresses imposed thereon. In some embodiments, a single, continuous piece of conductive foil may be used to form the negative or ground leads 112 and connecting flexible joints 136 therebetween in a given row.

The laminated busbar assembly 100 is beneficially designed to channel current along designated paths in the positive y direction. In this regard, the laminated busbar assembly 100 differs from a bulk plate, which allows current to flow freely therethrough and thus has areas in which current is highly concentrated. Unlike a bulk plate, which must be designed to handle such current concentrations without failing, the laminated busbar assembly 100 spreads current out evenly, and can therefore comprise a uniform design.

Current collectors 128 are provided along the edges of the laminated busbar assembly 100 that are positioned in the positive y direction and in the negative y direction. One of these current collectors 128 (the current collector 128 positioned on the edge in the positive y direction) is in electrical communication with the adjacent negative or ground leads 112, while the other current collector 128 (the current collector 128 positioned on the edge in the negative y direction) is in electrical communication with the adjacent positive leads 108.

Also shown in FIG. 1 are a plurality of voltage measurement wires 120. The voltage measurement wires 120 may be actual wires, or any other suitable electrically conductive channel. The voltage measurement wires 120 extend from a connector 124 to each row of positive leads 108/negative leads 112 (with "rows" referring to adjacent pairs of positive leads 108/negative leads 112 in the x direction). The voltage measurement wires 120 do not carry current from cells to which the busbar is connected, but rather enable battery cell voltage to be measured.

In addition to or instead of the voltage measurement wires 120, a laminated busbar assembly 100 may comprise temperature measurement wires that extend from the connector 124 (or a separate connector like the connector 124) to temperature sensors mounted on the laminated busbar assembly 100. In some embodiments, the temperature sensors may be surface-mount thermistors. The temperature sensors may be mounted at positions on the laminated busbar assembly 100 that are near the positive leads 108 and/or negative leads 112, so that the temperature sensors can measure the temperature thereof (or so that the measured temperature is closer to the temperature thereof). Each temperature sensor may have its own electrical routing directly to the connector 124 or a separate but similar connector. The temperature sensors are not powered by the battery module or any one or more cells thereof.

Referring still to FIG. 1, a plurality of alignment apertures 132 on the laminate busbar assembly 100 are configured to receive mechanical locators that ensure proper alignment of the laminated busbar assembly 100 with a battery module. The mechanical locators may be, for example, posts that extend from or above a battery module. During installation of a laminated busbar assembly 100 on a battery module, there is a risk that a positive lead 108 or negative lead 112 will, inadvertently, simultaneously come in contact with both the positive and negative terminals of a battery cell, which would result in a short circuit and could spark a fire or explosion. To reduce the risk of such inadvertent contact, the laminated busbar assembly 100 may be positioned over the battery module so that the posts or other mechanical locators are aligned with the apertures 132. The laminated busbar assembly 100 may then be safely lowered onto the battery module.

To make room in the laminated busbar assembly 100 for the apertures 132, nearby positive leads 108 may be slanted in the positive x or negative x directions. The fusible links 116 to which such slanted positive leads 108 are attached may have a different shape than, but still the same purpose as, the fusible links 116.

Once the laminated busbar assembly 100 is lowered onto a battery module, each positive lead 108 may be laser welded to the positive terminal of a corresponding cell of the battery module. Shown on several of the positive leads 108 of the laminated busbar assembly 100 is a laser weld pattern 140, showing a set of points at which the positive lead 108 may be welded to the battery cell. In other embodiments, a different laser weld pattern may be used. The negative leads 112 may also be welded onto the negative terminals of corresponding battery cells, whether using the laser weld pattern 144 or any other suitable pattern.

In some embodiments, one or both of the positive leads 108 and the negative leads 112 may be spot welded to the corresponding battery cell terminal. Also in some embodiments, the positive leads 108 and/or the negative leads 112 may be affixed to the appropriate battery cell terminals using means other than welding, including by the application of adhesive or the use of one or more mechanical fasteners.

Laminated busbar assemblies of the present disclosure, such as the laminated busbar assembly 100, are somewhat floppy due to their minimal thickness. As a result, laminated busbar assemblies according to embodiments of the present disclosure beneficially have a tendency to lay flat on and even conform to an underlying surface. Thus, for example, when a laminated busbar assembly 100 is aligned with and placed on top of a battery module, the positive leads 108 and the negative leads 112 rest in contact with the positive and negative terminals of the individual cells, without needing to be forced down or otherwise manipulated to establish contact. This reduces the expense and complexity of attaching a laminated busbar assembly as disclosed herein to a battery module, while reducing the risk of faulty connections between the laminated busbar assembly and the cells of the battery module.

Embodiments of the present disclosure also beneficially reduce busbar complexity relative to prior art busbars. More specifically, while some known busbars comprise a wire that extends between the busbar and a battery cell terminal to establish an electrical connection therebetween, laminated busbar assemblies as disclosed herein do not require such wires, thus reducing complexity and also reducing cost.

Figure 2:
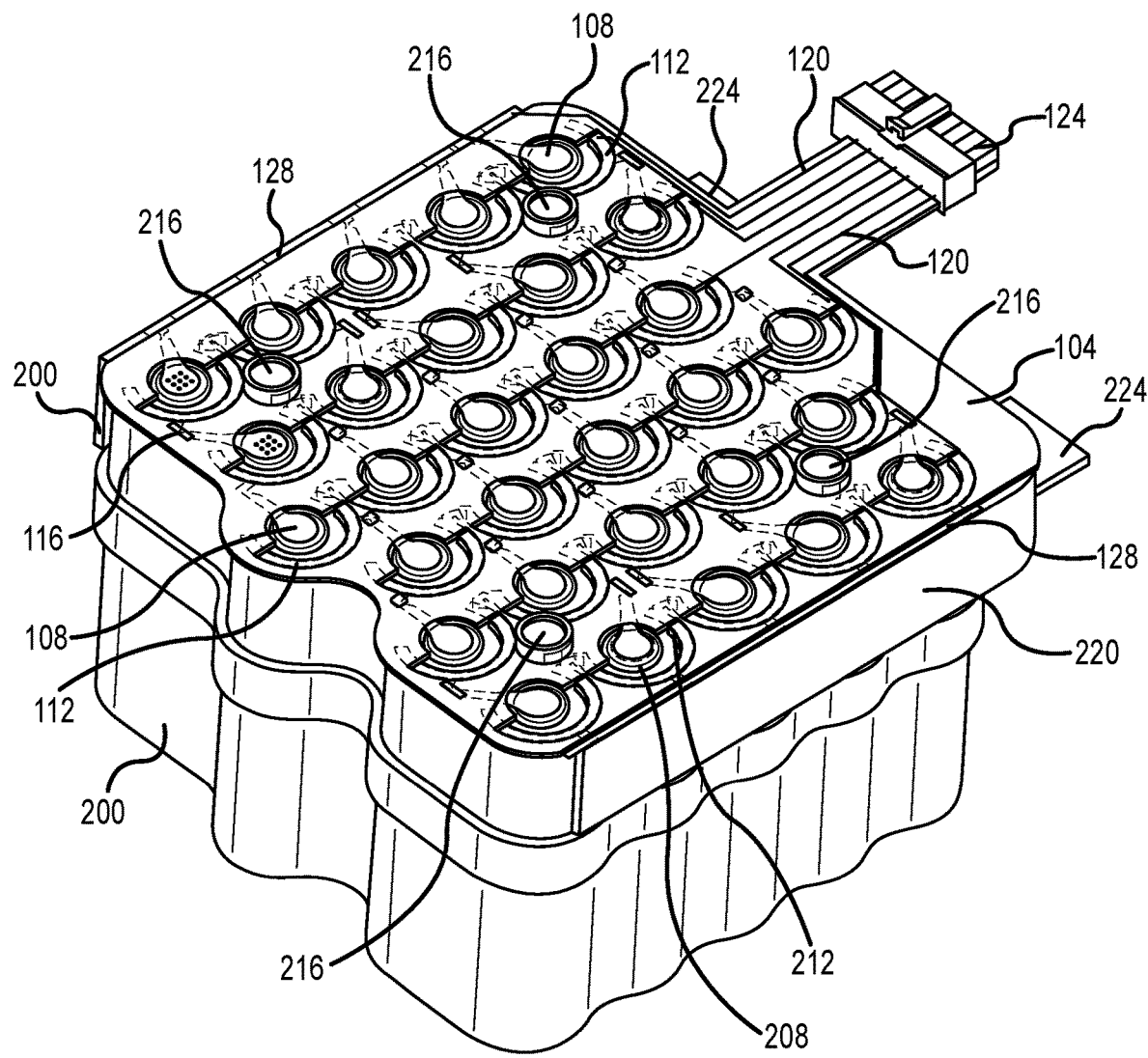
FIG. 2 shows a laminate busbar assembly on a battery module in accordance with embodiments of the present disclosure.

FIG. 2 shows a laminated busbar assembly 100 installed on a battery module or bank of electrical cells 200. The battery module 200 comprises a plurality of cells 204, each having a positive terminal 208 and a negative terminal 212. Although the cells 204 of the battery module 200 are shown in FIG. 2 as being cylindrical in shape, in other embodiments one or more cells 204 may have a non-cylindrical shape. The battery module 200 may comprise individual cells 204 that utilize any known battery chemistry, such as lead acid, nickel cadmium, lithium ion, or nickel metal hydride.

The battery module 200 also comprises four posts 216 that comprise mechanical locators for the purpose of properly aligning the laminated busbar assembly 100 with the battery module 200. More specifically, the posts 216 are positioned to align with the apertures 132 of the laminated busbar assembly 100. When the laminated busbar assembly 100 is lowered over the battery module 200 with the apertures 132 positioned to receive the posts 216, each positive lead 108 of the laminated busbar assembly 100 is properly aligned with the positive terminal 208 of a corresponding cell 204 of the battery module 200, and each negative or ground lead 112 of the laminated busbar assembly 100 is properly aligned with the negative terminal 212 of a corresponding cell 204 of the battery module 200. The posts 216 may be configured to remain in place during use of the battery module 200 and laminated busbar assembly 100, or the posts 216 may be removable so that once the laminated busbar assembly 100 is secured to the battery module 200, the posts 216 may be removed and either used elsewhere or discarded.

Once the laminated busbar assembly 100 is positioned on the battery module 200, each positive lead 108 may be welded or otherwise secured to the positive terminal 208 of the cell 204 with which the positive lead 108 is in contact. The welding may be laser welding, spot welding, or any other suitable form of welding. In some embodiments, an adhesive (which may be, for example, a double-sided tape, chemically activated glue, heat activated glue, or any other adhesive, and which may be conductive) may be used instead of welding, or may be used to prevent relative movement of the positive lead 108 and the positive terminal 112 during welding. The welding may follow the weld pattern 140, or another pattern. In embodiments where adhesive is used, the welds may be positioned adjacent to or in between the adhesive, or the welds may pass directly through the adhesive.

Also, once the laminated busbar assembly 100 is positioned on the battery module 200, each negative lead 112 may be welded or otherwise secured to the negative terminal 212 of the cell 204 with which the negative lead 112 is in contact. Here again, the welding may be laser welding, spot welding, or any other suitable form of welding. In some embodiments, an adhesive (which may be, for example, a double-sided tape, chemically activated glue, heat activated glue, or any other adhesive, and which may be conductive) may be used instead of welding, or may be used to prevent relative movement of the negative lead 108 and the negative terminal 112 during welding. The welding may follow any desired pattern. In embodiments where adhesive is used, the welds may be positioned adjacent to or in between the adhesive, or the welds may pass directly through the adhesive.

With the laminated busbar assembly 100 positioned on top of the battery module 200, each connector 128 lines up with a conductive block 200. The conductive block 200 may be formed of aluminum, copper, or a metal or conductor other than aluminum or copper. The connectors 128 may be secured to the corresponding conductive block 200 using any means described herein, including laser welding, spot welding, and/or with adhesive, or by similar means. Each conductive block 200 terminates in a battery module terminal 224, to which leads may be connected so as extract electricity from the battery module 200 or to recharge the battery module 200.

Figure 3:
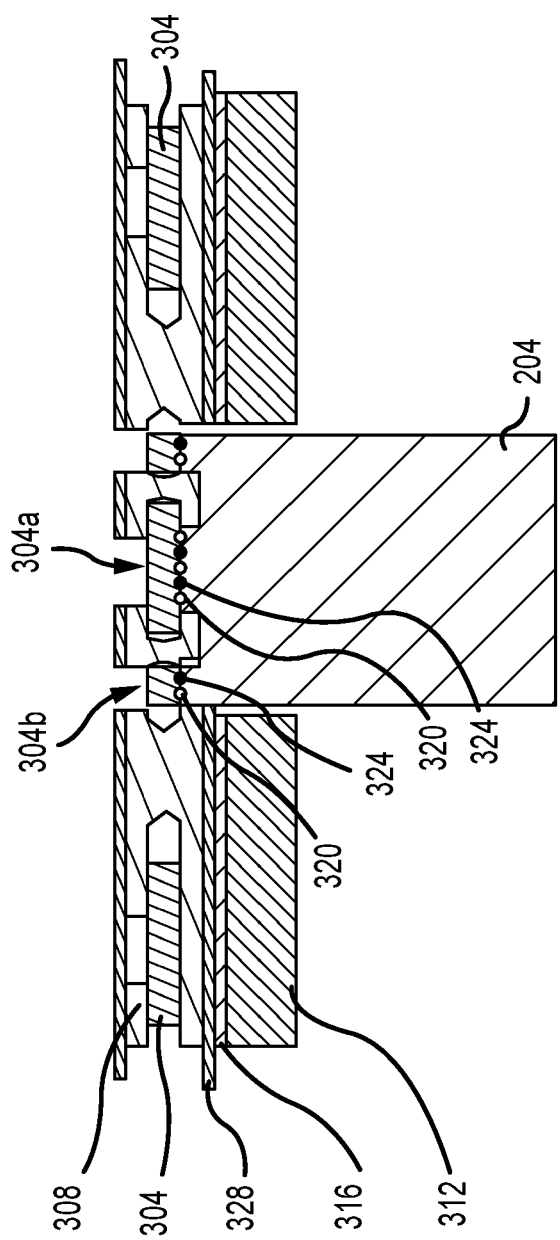
FIG. 3 shows a sectional view of a laminate busbar assembly in accordance with embodiments of the present disclosure.

FIG. 3 provides a sectional view of a laminated busbar assembly 300, which is the same as or substantially similar to the laminated busbar assembly 100. FIG. 3 also shows a cell 204 to which the laminated busbar assembly is attached. FIG. 3 is not to scale.

As seen in FIG. 3, the laminated busbar assembly 300 comprises an insulative layer 308. The insulative layer 308 may serve as a flame barrier and may comprise, for example, a flame barrier material such as a 3M™ Flame Barrier FRB-series material. The 3M™ Flame Barrier FRB series includes the FRB-BK subseries, the FRB-NC subseries, the FRB-NT subseries, and the FRB-WT subseries. Other heat-resistant materials may also be used for the insulative layer 308. The insulative layer 308 may be resistant to expansion or shrinkage due to temperature changes or may not expand or shrink due to changes in temperature.

The laminated busbar assembly 300 also comprises a conductive layer comprising busbar segments 304, including a busbar segment 304a for attachment to a positive terminal of the cell 204 (the busbar segment 304a corresponding to the positive leads 108 of the laminated busbar assembly 100) and a busbar segment 304b for attachment to a negative or ground terminal of the cell 204 (the busbar segment 304b corresponding to the negative or ground leads 112 of the laminated busbar assembly 100). The conductive busbar segments 304 may be formed of aluminum, copper, or any metal or conductor other than aluminum or copper. The busbar segments 304 may be, in some embodiments, between about 200 microns and about 300 microns thick, or may be about 250 microns thick. In other embodiments, the busbar segments 304 may be between about 100 microns and about 1000 microns thick.

The laminated busbar assembly 300 may also comprise a coating 328 on the upper and/or lower surfaces of the insulative layer 308. The coating 328 may be, for example, alumina or another ceramic material. In some embodiments, the coating 328 may be any electrically insulative material. The coating may be, for example, between 4 and 10 microns thick, or may be about 6 microns thick. In some embodiments, a laminated busbar assembly 300 may not include a coating 328.

The insulative layer 308 (with the conductive layer embedded therein) may, in some embodiments, have a maximum thickness of between about 100 microns and about 600 microns. In other embodiments, the insulative layer 308 may have a maximum thickness between about 100 microns and 1000 microns.

The laminated busbar assembly 300 further comprises a carrier 312. The carrier 312 may improve the stiffness of the laminated busbar assembly 300, so as to prevent excessive sagging of the insulative material 308 and the busbar segments 304 in between cells 204 or other support points. The carrier 312 may be plastic in some embodiments. In some embodiments, the laminated busbar assembly 300 may not include a carrier 312.

In the laminated busbar assembly 300, an adhesive 316 is used to secure the coating 328 (and thus the insulative layer 308) to the carrier 312. The adhesive 316 may be double-sided tape, glue, or any other adhesive suitable for securing the carrier 312 to the coating 328, and may be a conductive adhesive. In some embodiments, the adhesive used for the adhesive 316 may be selected based on the materials of which the carrier 312 and the coating 328 are comprised. Additionally, in embodiments of the laminated busbar assembly 300 that do not comprise a coating 328, the carrier 312 may be adhered directly to the insulative layer 308, in which case the adhesive used for the adhesive 316 may be selected based on the materials of which the carrier 312 and the insulative layer 308 are comprised.

Also shown in FIG. 3 are portions of adhesive 324 between the lead 304a and the cell 204 and between the lead 304b and the cell 204. The adhesive 324 may be the same kind of adhesive as the adhesive 316 or a different kind of adhesive. Any suitable kind of adhesive, in any desired form, may be used for the adhesive 324. The adhesive 324 may have a primary purpose of securing the leads 304a and 304b to the cell 204 until welds 320 can be formed. Alternatively, the adhesive 324 may be intended to help secure the busbar segments 304a and 304b to the cell 204 even after the welds 320 are formed. The welds 320 may be formed using laser welding, spot welding, or other forms of welding suitable for securing the busbar segments 304 to a corresponding terminal of a battery cell such as the cell 204.

Although FIG. 3 shows alternating placement of the adhesive 324 and the welds 320 between the leads 304a, 304b and the cell 204, in some embodiments the welds 320 may be located in the same position as the adhesive 324. In other words, the adhesive 324 may be used to secure leads 304a, 304b to the cell 204, after which the leads 304a, 304b may be welded to the cell 204, with the welds 320 passing directly through the adhesive 324.

Throughout the present disclosure, a reference to "metal" refers to any metal or metal alloy.

While various leads discussed herein have been described as positive leads or negative or ground leads, in some embodiments a lead described herein as a positive lead may instead be intended for connection to a negative or ground terminal of a battery, and a lead described herein as a negative or ground lead may instead be intended for connection to a positive lead.

The features of the various embodiments described herein are not intended to be mutually exclusive. Instead, features and aspects of one embodiment may be combined with features or aspects of another embodiment. Additionally, the description of a particular element with respect to one embodiment may apply to the use of that particular element in another embodiment, regardless of whether the description is repeated in connection with the use of the particular element in the other embodiment.

Examples provided herein are intended to be illustrative and non-limiting. Thus, any example or set of examples provided to illustrate one or more aspects of the present disclosure should not be considered to comprise the entire set of possible embodiments of the aspect in question. Examples may be identified by the use of such language as "for example," "such as," "by way of example," "e.g.," and other language commonly understood to indicate that what follows is an example.

The systems and methods of this disclosure have been described in relation to the connection of a busbar to an electrical cell. However, to avoid unnecessarily obscuring the present disclosure, the preceding description omits a number of known structures and devices. This omission is not to be construed as a limitation of the scope of the claimed disclosure. Specific details are set forth to provide an understanding of the present disclosure. It should, however, be appreciated that the present disclosure may be practiced in a variety of ways beyond the specific detail set forth herein.

A number of variations and modifications of the disclosure can be used. It would be possible to provide for some features of the disclosure without providing others.

The present disclosure, in various embodiments, configurations, and aspects, includes components, methods, processes, systems and/or apparatus substantially as depicted and described herein, including various embodiments, subcombinations, and subsets thereof. Those of skill in the art will understand how to make and use the systems and methods disclosed herein after understanding the present disclosure. The present disclosure, in various embodiments, configurations, and aspects, includes providing devices and processes in the absence of items not depicted and/or described herein or in various embodiments, configurations, or aspects hereof, including in the absence of such items as may have been used in previous devices or processes, e.g., for improving performance, achieving ease, and/or reducing cost of implementation.

The foregoing discussion of the disclosure has been presented for purposes of illustration and description. The foregoing is not intended to limit the disclosure to the form or forms disclosed herein. In the foregoing Detailed Description for example, various features of the disclosure are grouped together in one or more embodiments, configurations, or aspects for the purpose of streamlining the disclosure. The features of the embodiments, configurations, or aspects of the disclosure may be combined in alternate embodiments, configurations, or aspects other than those discussed above. This method of disclosure is not to be interpreted as reflecting an intention that the claimed disclosure requires more features than are expressly recited in each claim. Rather, as the following claims reflect, inventive aspects lie in less than all features of a single foregoing disclosed embodiment, configuration, or aspect. Thus, the following claims are hereby incorporated into this Detailed Description, with each claim standing on its own as a separate preferred embodiment of the disclosure.

Embodiments include a laminate busbar assembly, comprising: a first plurality of first leads arranged in a first row, and a second plurality of first leads arranged in a second row; a first plurality of second leads arranged in the first row, and a second plurality of second leads arranged in the second row, each of the first plurality of second leads adjacent to a corresponding one of the first plurality of first leads, and each of the second plurality of second leads adjacent to a corresponding one of the second plurality of first leads; a heat-resistant dielectric sheet supporting the first plurality of first leads, the second plurality of first leads, the first plurality of second lead, and the second plurality of second leads; a connector with a plurality of voltage measurement wires extending therefrom, the connector and the plurality of voltage measurement wires secured to the dielectric sheet, wherein each first lead in the first plurality of first leads and the second plurality of first leads, and each second lead in the first plurality of second leads and the second plurality of second leads, is formed of metal foil.

Aspects of the above laminate busbar assembly include: wherein a portion of each of the first plurality of first leads, the second plurality of second leads, the first plurality of second leads, and the second plurality of second leads is sandwiched within the heat-resistant dielectric sheet; having a maximum thickness between about 100 microns and about 1000 microns; wherein each of the first plurality of first leads is connected, via a fusible link, to one of the second plurality of second leads; wherein adjacent ones of the first plurality of second leads are connected via a flexible joint, and adjacent ones of the second plurality of second leads are connected via a flexible joint; a current collector in electrical communication with the first plurality of second leads; wherein the metal foil has a maximum thickness between about 100 and 1000 microns; a plurality of temperature sensors secured to the dielectric sheet; wherein the metal foil is aluminum; and a plurality of alignment apertures.

Embodiments also include an electrical assembly comprising: a cell bank comprising a plurality of electric cells arranged in adjacent rows, each of the plurality of electrical cells comprising a first terminal and a second terminal; a laminate busbar assembly comprising: a dielectric sheet comprising a plurality of alignment apertures; a plurality of temperature sensors secured to the dielectric sheet; a plurality of lead pairs partially sandwiched within the dielectric sheet, each lead pair of the plurality of lead pairs comprising a first lead and a second lead, each of the first lead and the second lead comprising a metal foil; wherein the plurality of lead pairs are arranged in a plurality of rows, with a flexible joint establishing electrical communication between the second leads of adjacent ones of the plurality of lead pairs in each row; and a plurality of alignment posts extending from the cell bank, each alignment post extending through one of the plurality of alignment apertures.

Aspects of the above electrical assembly include: wherein a first lead of each lead pair in one of the plurality of rows is in electrical communication with a corresponding second lead of the lead pairs in another of the plurality of rows; wherein the second leads of each lead pair in one of the plurality of rows and the flexible joints therebetween comprise a continuous piece of the metal foil; wherein the second lead of each lead pair at least partially surrounds the first lead of the lead pair; wherein the first lead of each of the plurality of lead pairs is in electrical communication with the first terminal of a corresponding one of the plurality of electric cells; wherein the first lead of each of the plurality of lead pairs is secured to the first terminal of the corresponding one of the plurality of electric cells with adhesive; wherein the first lead of each of the plurality of lead pairs is welded to the first terminal of the corresponding one of the plurality of electric cells; and wherein the laminate busbar assembly further comprises a first current collector in independent electrical communication with the first lead of each lead pair in one of the plurality of rows and a second current collector in independent electrical communication with the second lead of each lead pair in another one of the plurality of rows.

Embodiments also include a busbar assembly comprising: a plurality of first leads and a plurality of second leads partially embedded in a heat-resistant sheet, the plurality of first leads arranged in rows, with each of the plurality of second leads partially surrounding a corresponding one of the plurality of first leads; wherein each of the plurality of first leads in a row is connected by a fusible link to one of the plurality of second leads in another row, each of the plurality of second leads is connected by a flexible joint to another of the plurality of second leads, and the heat-resistant sheet has a maximum thickness between about 100 microns and about 600 microns.

Aspects of the above busbar assembly include: wherein each of the plurality of first leads and each of the plurality of second leads comprises a metal foil.

Any one or more of the aspects/embodiments as substantially disclosed herein.

Any one or more of the aspects/embodiments as substantially disclosed herein optionally in combination with any one or more other aspects/embodiments as substantially disclosed herein.

One or means adapted to perform any one or more of the above aspects/embodiments as substantially disclosed herein.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The term "a" or "an" entity refers to one or more of that entity. As such, the terms "a" (or "an"), "one or more," and "at least one" can be used interchangeably herein. It is also to be noted that the terms "comprising," "including," and "having" can be used interchangeably.

What is claimed is:

1. A laminate busbar assembly, comprising:
a first plurality of first leads arranged in a first row, and a second plurality of first leads arranged in a second row;
a first plurality of second leads arranged in the first row, and a second plurality of second leads arranged in the second row, each of the first plurality of second leads adjacent to a corresponding one of the first plurality of first leads, and each of the second plurality of second leads adjacent to a corresponding one of the second plurality of first leads;
a heat-resistant dielectric sheet having an upper surface and a lower surface opposite the upper surface, the heat-resistant dielectric sheet supporting the first plurality of first leads, the second plurality of first leads, the first plurality of second leads, and the second plurality of second leads;
a ceramic coating on at least one of the upper surface or the lower surface of the heat-resistant dielectric sheet;
a connector with a plurality of voltage measurement wires extending therefrom, the connector and the plurality of voltage measurement wires being secured to the dielectric sheet,
wherein each first lead in the first plurality of first leads and the second plurality of first leads and each second lead in the first plurality of second leads and the second plurality of second leads is formed of metal foil,
wherein each of the first plurality of first leads is electrically connected, via a fusible link, to one of the second plurality of second leads, and
wherein the fusible link is not in contact with the heat-resistant dielectric sheet.

2. The laminate busbar assembly of claim 1, wherein a portion of each of the first plurality of first leads, the second plurality of first leads, the first plurality of second leads, and the second plurality of second leads is sandwiched within the heat-resistant dielectric sheet.

3. The laminate busbar assembly of claim 2, wherein the heat-resistant dielectric sheet has a maximum thickness between about 100 microns and about 1000 microns.

4. The laminate busbar assembly of claim 1, wherein each of the first plurality of first leads is connected, via a fusible link, to one of the second plurality of second leads.

5. The laminate busbar assembly of claim 1, wherein adjacent ones of the first plurality of second leads are connected via a flexible joint, and adjacent ones of the second plurality of second leads are connected via a flexible joint.

6. The laminate busbar assembly of claim 1, further comprising a current collector in electrical communication with the first plurality of second leads.

7. The laminate busbar assembly of claim 1, wherein the metal foil has a thickness between about 100 and 1000 microns.

8. The laminate busbar assembly of claim 1, further comprising a plurality of temperature sensors.

9. The laminate busbar assembly of claim 1, wherein the metal foil comprises aluminum.

10. The laminate busbar assembly of claim 1, further comprising a plurality of alignment apertures.

11. An electrical assembly comprising:
a cell bank comprising a plurality of electric cells arranged in adjacent rows, each of the plurality of electrical cells comprising a first terminal and a second terminal;
a laminate busbar assembly comprising:
a dielectric sheet comprising a plurality of alignment apertures, the dielectric sheet having an upper surface and a lower surface opposite the upper surface;
a ceramic coating on at least one of the upper surface and the lower surface of the dielectric sheet;
a plurality of temperature sensors secured to the dielectric sheet;
a plurality of lead pairs partially sandwiched within the dielectric sheet, each lead pair of the plurality of lead pairs comprising a first lead and a second lead, each of the first lead and the second lead comprising a metal foil,
wherein the plurality of lead pairs are arranged in a plurality of rows, with a flexible joint establishing electrical communication between the second leads of adjacent ones of the plurality of lead pairs in each row,
wherein each of the first leads of the plurality of lead pairs in a row is electrically connected, via a fusible link, to one of the second leads of the plurality of lead pairs in another row, and
wherein the fusible link is not in contact with the dielectric sheet; and
a plurality of alignment posts extending from the cell bank, each alignment post extending through one of the plurality of alignment apertures.

12. The electrical assembly of claim 11, wherein a first lead of each lead pair in one of the plurality of rows is in electrical communication with a corresponding second lead of the lead pairs in another of the plurality of rows.

13. The electrical assembly of claim 11, wherein the second leads of each lead pair in one of the plurality of rows and the flexible joints therebetween comprise a continuous piece of the metal foil.

14. The electrical assembly of claim 11, wherein the second lead of each lead pair at least partially surrounds the first lead of the lead pair.

15. The electrical assembly of claim 11, wherein the first lead of each of the plurality of lead pairs is in electrical communication with the first terminal of a corresponding one of the plurality of electric cells.

16. The electrical assembly of claim 15, wherein the first lead of each of the plurality of lead pairs is secured to the first terminal of the corresponding one of the plurality of electric cells with adhesive.

17. The electrical assembly of claim 15, wherein the first lead of each of the plurality of lead pairs is welded to the first terminal of the corresponding one of the plurality of electric cells.

18. The electrical assembly of claim 11, wherein the laminate busbar assembly further comprises:
    a first current collector in independent electrical communication with the first lead of each lead pair in one of the plurality of rows; and
    a second current collector in independent electrical communication with the second lead of each lead pair in another one of the plurality of rows.

19. A busbar assembly comprising: a plurality of first leads and a plurality of second leads partially embedded in a heat-resistant sheet, the plurality of first leads being arranged in rows, with each of the plurality of second leads partially surrounding a corresponding one of the plurality of first leads; a ceramic coating on at least one of an upper surface of the heat-resistant sheet or a lower surface of the heat-resistant sheet, the upper surface opposite the lower surface, and a connector with a plurality of voltage measurement wires extending therefrom, the connector and the plurality of voltage measurement wires being secured to the heat-resistant sheet, wherein each of the plurality of first leads in a row is electrically connected by a fusible link to one of the plurality of second leads in another row, each of the plurality of second leads is connected by a flexible joint to another of the plurality of second leads, and the heat-resistant sheet has a maximum thickness between about 100 microns and about 600 microns, and wherein the fusible link is not in contact with the heat-resistant sheet.

20. The busbar assembly of claim 19, wherein each of the plurality of first leads and each of the plurality of second leads comprises a metal foil.

* * * * *